United States Patent
Sjmaenok et al.

(10) Patent No.: US 9,897,930 B2
(45) Date of Patent: Feb. 20, 2018

(54) OPTICAL ELEMENT COMPRISING ORIENTED CARBON NANOTUBE SHEET AND LITHOGRAPHIC APPARATUS COMPRISING SUCH OPTICAL ELEMENT

(75) Inventors: Leonid Aizikovitch Sjmaenok, Vaals (NL); Vadim Yevgenyevich Banine, Deurne (NL); Johannes Hubertus Josephina Moors, Helmond (NL); Denis Alexandrovich Glushkov, Witten (DE); Andrei Mikhailovich Yakunin, Mierlo (NL)

(73) Assignee: ASML NETHERLANDS B.V., Veldhoven (NL)

( * ) Notice: Subject to any disclaimer, the term of this patent is extended or adjusted under 35 U.S.C. 154(b) by 1564 days.

(21) Appl. No.: 13/057,583

(22) PCT Filed: Jul. 22, 2009

(86) PCT No.: PCT/EP2009/059398
§ 371 (c)(1),
(2), (4) Date: Feb. 4, 2011

(87) PCT Pub. No.: WO2010/015508
PCT Pub. Date: Feb. 11, 2010

(65) Prior Publication Data
US 2011/0249243 A1    Oct. 13, 2011

Related U.S. Application Data

(60) Provisional application No. 61/136,010, filed on Aug. 6, 2008.

(51) Int. Cl.
*G03F 7/20*    (2006.01)

(52) U.S. Cl.
CPC .......... *G03F 7/70958* (2013.01); *G03F 7/702* (2013.01); *G03F 7/70191* (2013.01);
(Continued)

(58) Field of Classification Search
CPC ............. G03F 7/70191; G03F 7/70308; G03F 7/70958; G03F 7/70916
See application file for complete search history.

(56) References Cited

U.S. PATENT DOCUMENTS

| 7,250,620 B2 | 7/2007 | Wurm et al. |
| 2004/0130693 A1 | 7/2004 | Kurt |

(Continued)

FOREIGN PATENT DOCUMENTS

| CN | 1499297 | 5/2004 |
| EP | 1416329 A1 | 5/2004 |

(Continued)

OTHER PUBLICATIONS

International Search Report for PCT International Patent Application No. PCT/EP2009/059398, dated Feb. 3, 2010.
(Continued)

*Primary Examiner* — Chia-How Michael Liu
(74) *Attorney, Agent, or Firm* — Pillsbury Winthrop Shaw Pittman LLP

(57) ABSTRACT

A lithographic apparatus includes an optical element that includes an oriented carbon nanotube sheet. The optical element has an element thickness in the range of about 20-500 nm and has a transmission for EUV radiation having a wavelength in the range of about 1-20 nm of at least about 20% under perpendicular irradiation with the EUV radiation.

18 Claims, 4 Drawing Sheets

(52) U.S. Cl.
CPC ...... *G03F 7/70308* (2013.01); *G03F 7/70575* (2013.01); *G03F 7/70916* (2013.01)

(56) References Cited

U.S. PATENT DOCUMENTS

| | | | |
|---|---|---|---|
| 2005/0117233 A1 | 6/2005 | Kanazawa et al. | |
| 2005/0181209 A1* | 8/2005 | Karandikar | 428/408 |
| 2006/0057050 A1* | 3/2006 | Ren | B82Y 30/00 |
| | | | 423/291 |
| 2006/0160031 A1 | 7/2006 | Wurm et al. | |
| 2008/0152873 A1 | 6/2008 | Okoroanyanwu et al. | |

FOREIGN PATENT DOCUMENTS

| | | |
|---|---|---|
| JP | 05-121299 | 5/1993 |
| JP | 6-184738 | 7/1994 |
| JP | 8-5795 | 1/1996 |
| JP | 2001-48507 | 2/2001 |
| JP | 2005-156201 | 6/2005 |
| JP | 2006-49761 | 2/2006 |
| JP | 2006-69165 | 3/2006 |
| JP | 2006-171577 | 6/2006 |
| JP | 2006-224604 | 8/2006 |
| JP | 2007-73217 | 3/2007 |
| JP | 2008-169092 | 7/2008 |
| KR | 1020050111619 | 11/2005 |
| WO | WO 2004/092693 | 10/2004 |

OTHER PUBLICATIONS

International Preliminary Report on Patentability for PCT International Patent Application No. PCT/EP2009/059398, dated Feb. 17, 2011.
Korean Office Action dated Sep. 19, 2016 for corresponding Korean Patent Application No. 10-2016-7020693 (9 pages).

* cited by examiner

OPTICAL ELEMENT COMPRISING ORIENTED CARBON NANOTUBE SHEET AND LITHOGRAPHIC APPARATUS COMPRISING SUCH OPTICAL ELEMENT

CROSS-REFERENCE TO RELATED APPLICATIONS

This application is the U.S. National Phase application of PCT/EP2009/059398, filed Jul. 22, 2009, which claims the benefit of US patent application No. 61/136,010, which was filed on 6 Aug. 2008, and which is incorporated herein in its entirety by reference.

FIELD

The present invention relates to an optical element for a lithographic apparatus and to a lithographic apparatus comprising such optical element. The invention also relates to a method for the production of the optical element.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. including part of one or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include steppers, in which each target portion is irradiated by exposing an entire pattern onto the target portion at one time, and scanners, in which each target portion is irradiated by scanning the pattern through a radiation beam in a given direction (the "scanning" direction) while synchronously scanning the substrate parallel or anti-parallel to this direction. It is also possible to transfer the pattern from the patterning device to the substrate by imprinting the pattern onto the substrate.

In a lithographic apparatus, the size of features that can be imaged onto the substrate is limited by the wavelength of the projection radiation. To produce integrated circuits with a higher density of devices, and hence higher operating speeds, it is desirable to be able to image smaller features. While most current lithographic projection apparatus employ ultraviolet light generated by mercury lamps or excimer lasers, it has been proposed to use shorter wavelength radiation, e.g. of around 13 nm. Such radiation is termed extreme ultraviolet (EUV) or soft x-ray, and possible sources include, for example, laser-produced plasma sources, discharge plasma sources, or synchrotron radiation from electron storage rings.

The source of EUV radiation is typically a plasma source, for example a laser-produced plasma or a discharge source. A common feature of any plasma source is the production of fast ions and atoms, which are expelled from the plasma in all directions. These particles can be damaging to the collector and condenser mirrors which are generally multi-layer mirrors or grazing incidence mirrors, with fragile surfaces. This surface is gradually degraded due to the impact, or sputtering, of the particles expelled from the plasma and the lifetime of the mirrors is thus decreased. The sputtering effect is particularly problematic for the radiation collector or collector mirror. The purpose of this mirror is to collect radiation which is emitted in all directions by the plasma source and direct it towards other mirrors in the illumination system. The radiation collector is positioned very close to, and in line-of-sight with, the plasma source and therefore receives a large flux of fast particles from the plasma. Other mirrors in the system are generally damaged to a lesser degree by sputtering of particles expelled from the plasma since they may be shielded to some extent.

In the near future, extreme ultraviolet (EUV) sources will probably use tin (Sn) or another metal vapor to produce EUV radiation. This tin may leak into the lithographic apparatus, and will be deposited on mirrors in the lithographic apparatus, e.g. the mirrors of the radiation collector. The mirrors of such a radiation collector may have a EUV reflecting top layer of, for example, ruthenium (Ru). Deposition of more than approximately 10 nm tin (Sn) on the reflecting Ru layer will reflect EUV radiation in the same way as bulk Sn. The overall transmission of the collector will decrease significantly, since the reflection coefficient of tin is much lower than the reflection coefficient of ruthenium. In order to prevent debris from the source or secondary particles generated by this debris from depositing on the radiation collector, contaminant barriers may be used. Though such contaminant barriers or traps may remove part of the debris, still some debris will deposit on the radiation collector or other optical elements.

In order to remove unwanted deposition, cleaning methods have been discussed, including for instance hydrogen radical cleaning, such as for instance described in WO2008002134.

The source of EUV radiation is typically a plasma source, for example a laser-produced plasma or a discharge source. In some instances, an EUV source may emit several different wavelengths of light, some of which may be undesired radiation, such as deep ultra-violet radiation (DUV) and/or IR. This non-EUV radiation can, in some instances, be harmful for the EUV lithography system because it can result in a loss of contrast. Thus, it may be desirable to have such undesirable radiation removed by a spectral purity filter (SPF). European Patent Application Publication No. 1197803 for instance, describes a lithographic projection apparatus, wherein a grating spectral filter is used to filter an EUV projection beam. The grating spectral filter is preferably a blazed, grazing incidence, reflective grating. Cooling channels may be provided in or on the rear of the grating spectral filter. The grating spectral filter may be formed of a material effectively invisible to the desired radiation.

SUMMARY

It is an aspect of the present invention to provide an lithographic apparatus that includes an alternative optical element that may in an embodiment be designed to reduce debris from the lithographic apparatus source. In an embodiment, the optical element may be designed to reduce undesired radiation such as DUV and/or IR radiation.

In accordance therewith, in an embodiment of the invention, there is provided a lithographic apparatus that includes an optical element. The optical element includes an oriented carbon nanotube sheet. The optical element has an element thickness in the range of about 20-500 nm and has a transmission for EUV radiation having a wavelength in the range of about 1-20 nm of at least about 20% under perpendicular irradiation with the EUV radiation. In an embodiment, the EUV radiation has a wavelength in the range of about 13-14 nm, especially about 13.3-13.7 nm, such as about 13.5 nm, or a wavelength in the range of about 6-7 nm. In an embodiment, the transmission of at least about 20% applies for all wavelengths in one or more of the above defined wavelength regions (such as about 13.3-13.7 nm or about 6-7 nm). The phrase "a transmission for EUV radiation having a wavelength in the range of x-y nm of at least about 20%" may indicate that for a predetermined wavelength selected from the indicated range, the transmission is at least about 20%. This does not exclude that at other wavelengths within the same range, the transmission may be smaller. The transmission over the complete indicated range(s) is at least about 10%, more especially at least about 20%. Methods to produce oriented carbon nanotube sheets are for instance disclosed by K. R. Atkinson et al. in Physica B 394 (2007) 339-343.

The oriented carbon nanotube sheet may be used per se as optical element, for instance designed to reduce debris and/or improve the ratio of EUV/non-desired radiation. Such a sheet, due to its strength, does not necessarily needs a support. Hence, the optical element of the invention may be unsupported. In an embodiment, the optical element is self-supporting.

In an embodiment, the optical element may further comprise an EUV transparent material layer, wherein the EUV transparent material layer and the nanotube sheet form a laminate. Such an EUV transparent material layer may be arranged to further increase the ratio of EUV/non-desired radiation and/or to reduce or even eliminate propagation of debris while allowing transmission of EUV radiation.

The EUV transparent material layer of the optical element especially comprises one or more elements selected from the group consisting of Be, B, C, Si, P, S, K, Ca, Sc, Sr, Rb, Y, Zr, Nb, Mo, Ru, Rh, Ag, Ba, La, Ce, Pr, Ir, Au, Pa and U, even more especially B, C, Si, Sr, Sc, Ru, Mo, Y and Zr, and yet even more especially Zr. The transparent material layer may be a metallic layer (for those elements that may be metallic at room temperature).

However, also compounds comprising one or more of these elements may be applied as transparent material layer. In an embodiment, the EUV transparent material layer of the optical element comprises one or more materials selected from the group consisting of oxides, borides, and nitrides, which are solid at room temperature, of the one or more elements selected from the group consisting of Be, B, C, Si, P, S, K, Ca, Sc, Sr, Rb, Y, Zr, Nb, Mo, Ru, Rh, Ag, Ba, La, Ce, Pr, Ir, Au, Pa and U.

The layer may be a single layer or may comprise a plurality of layers.

Combinations of such elements may be applied, either as separate layers (i.e. "laminate" or "laminate stack"), or as compounds or alloys. In an embodiment, the EUV transparent material layer of the optical element comprises one or more materials selected from the group consisting of SiC, $B_4C$ and $Si_3N_4$.

The EUV transparent material layer of the optical element may have a layer thickness in the range of up to about 200 nm, such as about 5-200 nm, like about 5-100 nm.

In an embodiment, the optical element further comprises EUV transparent material particles, wherein the EUV transparent material particles are dispersed within the nanotube sheet, wherein the optical element optionally also comprises single atoms. This embodiment may be combined with the embodiments described above, i.e. the optical element comprises a transparent material layer and transparent material particles dispersed within the nanotube sheet.

The EUV transparent material particles of the optical element especially comprise one or more elements selected from the group consisting of Be, B, C, Si, P, S, K, Ca, Sc, Sr, Rb, Y, Zr, Nb, Mo, Ru, Rh, Ag, Ba, La, Ce, Pr, Ir, Au, Pa and U, especially B, C, Si, Sr, Sc, Ru, Mo, Y and Zr, even more especially Zr. The transparent material particles may be metallic particles (for those elements that may be metallic at room temperature).

Compounds comprising one or more of these elements may be applied as transparent material layer. In an embodiment, the EUV transparent material particles of the optical element comprise one or more materials selected from the group consisting of oxides, borides, and nitrides, which are solid at room temperature, of the one or more elements selected from the group consisting of Be, B, C, Si, P, S, K, Ca, Sc, Sr, Rb, Y, Zr, Nb, Mo, Ru, Rh, Ag, Ba, La, Ce, Pr, Ir, Au, Pa and U.

Combinations of such elements may be applied, either as different type of particles, or as particles comprising compounds or alloys. In an embodiment, the EUV transparent material particles of the optical element comprise one or more materials selected from the group consisting of SiC, $B_4C$ and $Si_3N_4$, especially $B_4C$. In an embodiment, the EUV transparent material particles comprise Si particles and/or Zr particles.

The EUV transparent material particles of the optical element may have a mean particle size in the range of up to about 50 nm, such as about 5-50 nm.

The oriented carbon nanotube sheet of the optical element may comprise an oriented single-wall carbon nano-tube sheet. In an embodiment, the oriented carbon nanotube sheet of the optical element may comprise an oriented multi-wall carbon nano-tube sheet.

The oriented carbon nanotube sheet of the optical element may have a sheet thickness in the range of about 10-500 nm. As mentioned above, the layer thickness of the optional EUV transparent material layer may be in the range up to about 200 nm, such as about 5-200 nm. In total, the element thickness of the optical element may be in the range of about 20-500 nm. Here, the element thickness only relates to that part that is used as optical element, i.e. is especially used for transmission of EUV light. Optional holders or optional support structures are not included in the thicknesses described above.

The optical element may have a transmission for EUV radiation having a wavelength in the range of about 1-20 nm in the range of about 30-95% under perpendicular irradiation with the EUV radiation. The transmission may depend upon the sheet thickness of the carbon-nanotube sheet, the layer thickness of the optical transmissve material layer and the density and particle size of the optional EUV transmissive particles. The person skilled in the art may choose those parameters in such a way to obtain the desired transmission.

Embodiments of the invention are directed to the lithographic apparatus comprising the optical element as well as to the optical element per se. Embodiments of the invention also provide an optical element comprising an oriented carbon nanotube sheet, the optical element having an element thickness in the range of about 20-500 nm and having a transmission for EUV radiation having a wavelength in the range of about 1-20 nm of at least about 20% under perpendicular irradiation with the EUV radiation. All embodiments described herein that are related to the optical element in the lithographic apparatus also apply to the optical element per se.

Within the lithographic apparatus, the optical element may in an embodiment be arranged as a transmissive spectral purity filter. Hence, embodiments of the invention are also directed to a spectral purity filter comprising the optical filter according to embodiments of the invention.

In an embodiment, the optical element is arranged as a gas-lock. The gas-lock according to embodiments of the invention may have an element thickness (i.e. the thickness of the optical element) above about 50 nm, such as in the range of about 50-500 nm, especially in the range of 300-500 nm. Such a gas-lock may withstand considerable pressure differences. Hence, embodiments of the invention are also directed to a gas-lock comprising the optical element according to the invention.

In an embodiment, the optical element is arranged as a window within the lithographic apparatus. Such a window may be a gas-lock, but may also be a window between compartments having substantially the same pressure. Hence, embodiments of the invention are also directed to a window comprising the optical element according to the invention.

The lithographic apparatus according to an embodiment of the invention has a source of EUV radiation and further optical elements such as mirrors, etc. The optical element may be arranged as a debris trapping system arranged downstream of the source of EUV radiation and upstream of the further optical elements. Such debris trapping system is described below as "contamination trap". The debris trapping system according to an embodiment of the invention may substitute such contamination trap or may be applied in addition of such contamination traps, either upstream or downstream of such contamination traps. Hence, an embodiment of the invention is also directed to a debris trapping system, especially arrangeable downstream of the source of EUV radiation and upstream of the further optical elements of lithographic apparatus.

The optical element may be arranged as a mask pellicle within the lithographic apparatus, for instance between a last optical element before the mask and the mask itself (thus downstream of a last optical element before the mask and upstream of the mask itself). Such a mask pellicle may further reduce debris from reaching the target, and/or reduce undesired radiation such as IR and/or DUV radiation and/or may reduce influx of undesired components into the mask upstream parts of the lithographic apparatus. Hence, an embodiment of the invention is directed to a mask pellicle, arrangeable downstream of a last optical before the mask and upstream of the mask of a lithographic apparatus.

As should be clear to the person skilled in the art, the lithographic apparatus according to an embodiment of the invention may comprise one or more devices selected from the group consisting of a transmissive spectral purity filter, a gas-lock, a window, a debris trapping system, and a mask pellicle.

An embodiment of the invention is also directed to a multi-layer mirror comprising an oriented carbon nanotube sheet having a sheet thickness in the range of about 10-500 nm as a top layer. Such multi-layer mirrors may comprise alternating layers selected from the group consisting of Mo, Si, SiC, C, B, $B_4C$ and $Si_3N_4$. On top of such a mirror, the nano-tube sheet may be applied, which allows further reduction of undesired radiation, and/or protection of the multi-layer mirror.

As mentioned above, the production of nano-tube sheets per se is known in the art. The production of the specific embodiments of the optical element comprising the transparent material layer, or the transparent material particles (or both) is also part of the present invention.

In an aspect of embodiments of the invention, there is provided a method for the production of an optical element comprising an oriented multi-wall carbon nanotube sheet and an EUV transparent material. The method includes providing an oriented carbon nanotube sheet, and providing (by sputtering, for example) the EUV transparent material, or a precursor thereof, to the oriented multi-wall carbon nanotube sheet. The sputtering may comprise magnetron sputtering, however, also other methods may be applied, such as e-beam sputtering, laser sputtering, plasma assisted film growth, CVD (chemical vapor deposition) or a combination of two or more of these techniques. During sputtering, the nanotube sheet may be heated, especially at a temperature in the range of about 100-1000° C., such as about 500-1000° C., for example, to further improve layer formation and/or particles dispersion. After sputtering, the product obtained, i.e. the optical element with the nanoparticles or the optical element comprising the transparent material layer, may be annealed, for example, to further improve layer formation and/or particles dispersion.

Optionally, subsequent to sputtering, the sputtered EUV transparent material is reacted with a fluid comprising one or more elements selected from the group consisting of B, C, N and O, especially selected from the group consisting of nitrogen and oxygen (such as $N_2$, $O_2$, NO, $NO_2$, etc.).

BRIEF DESCRIPTION OF THE DRAWINGS

Embodiments of the present invention will now be described, by way of example only, with reference to the accompanying schematic drawings in which corresponding reference symbols indicate corresponding parts, and in which.

DETAILED DESCRIPTION

Figure 1:
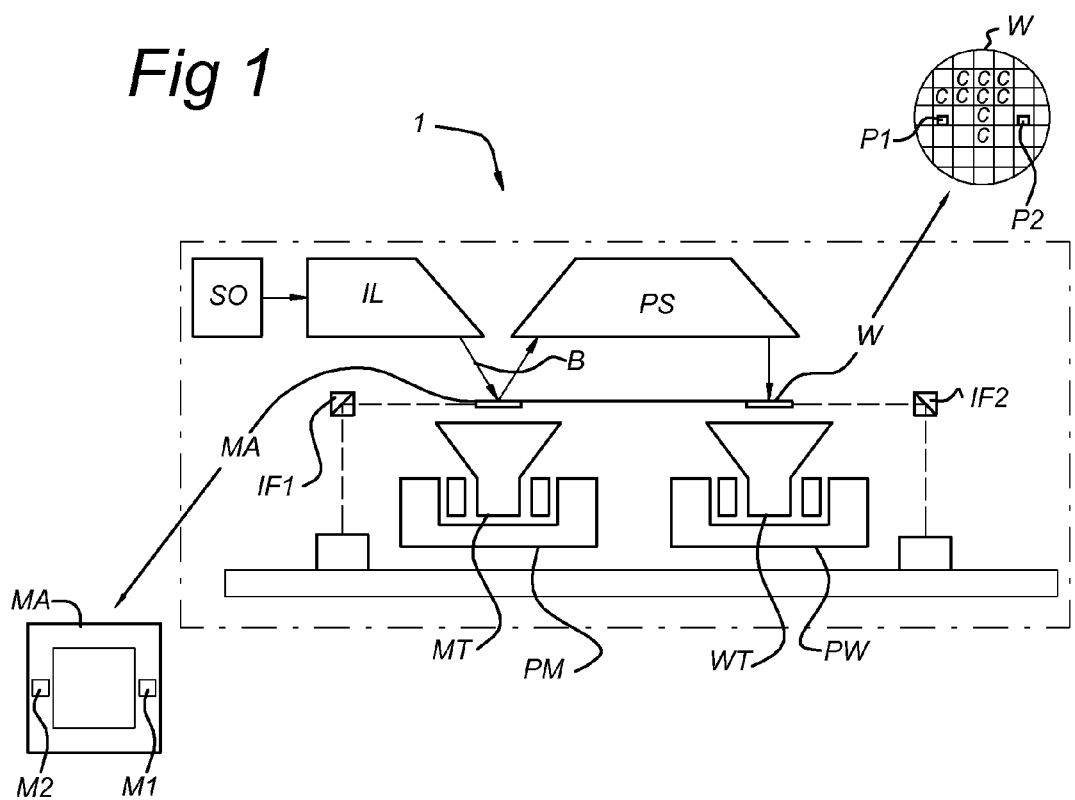
FIG. 1 schematically depicts a lithographic apparatus according to an embodiment of the present invention.

FIG. 1 schematically depicts a lithographic apparatus 1 according to an embodiment of the present invention. The apparatus 1 includes a source SO for generating radiation, an illumination system (illuminator) IL configured to condition a radiation beam B (e.g. UV radiation or EUV radiation) from the radiation received from source SO. The source SO may be provided as a separate unit. A support (e.g. a mask table) MT is configured to support a patterning device (e.g. a mask) MA and is connected to a first positioning device PM configured to accurately position the patterning device MA in accordance with certain parameters. A substrate table (e.g. a wafer table) WT is configured to hold a substrate (e.g. a resist-coated wafer) W and is connected to a second positioning device PW configured to accurately position the substrate W in accordance with certain parameters. A projection system (e.g. a refractive projection lens system) PS is configured to project a pattern imparted to the radiation beam B by patterning device MA onto a target portion C (e.g. including one or more dies) of the substrate W.

The illumination system may include various types of optical components, such as refractive, reflective, magnetic, electromagnetic, electrostatic or other types of optical components, or any combination thereof, to direct, shape, or control radiation.

The support supports, e.g. bears the weight of, the patterning device. It holds the patterning device in a manner that depends on the orientation of the patterning device, the design of the lithographic apparatus, and other conditions, such as for example whether or not the patterning device is held in a vacuum environment. The support can use mechanical, vacuum, electrostatic or other clamping techniques to hold the patterning device. The support may be a frame or a table, for example, which may be fixed or movable as required. The support may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a reflective type (e.g. employing a reflective mask). Alternatively, the apparatus may be of a transmissive type (e.g. employing a transmissive mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located, for example, between the projection system and the substrate during exposure.

Referring to FIG. 1, the illuminator IL receives radiation from a radiation source SO. The source and the lithographic apparatus may be separate entities, for example when the source is an excimer laser. In such cases, the source is not considered to form part of the lithographic apparatus and the radiation is passed from the source SO to the illuminator IL with the aid of a beam delivery system including, for example, suitable directing mirrors and/or a beam expander. In other cases the source may be an integral part of the lithographic apparatus, for example when the source is a mercury lamp. The source SO and the illuminator IL, together with the beam delivery system if required, may be referred to as a radiation system.

The illuminator IL may include an adjusting device configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator and a condenser. The illuminator may be used to condition the radiation beam, to have a desired uniformity and intensity distribution in its cross-section.

The radiation beam B is incident on the patterning device (e.g., mask MA), which is held on the support (e.g., mask table MT), and is patterned by the patterning device. Having traversed the mask MA, the radiation beam B passes through the projection system PS, which projects the beam onto a target portion C of the substrate W. With the aid of the second positioning device PW and position sensor IF2 (e.g. an interferometric device, linear encoder or capacitive sensor), the substrate table WT can be moved accurately, e.g. so as to position different target portions C in the path of the radiation beam B. Similarly, the first positioning device PM and another position sensor IF1 (e.g. an interferometric device, linear encoder or capacitive sensor) can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioning device PM. Similarly, movement of the substrate table WT may be realized using a long-stroke module and a short-stroke module, which form part of the second positioning device PW. In the case of a stepper, as opposed to a scanner, the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

a. In step mode, the mask table MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

b. In scan mode, the mask table MT and the substrate table WT are scanned synchronously while a pattern imparted to the radiation beam is projected onto a target portion C (i.e. a single dynamic exposure). The velocity and direction of the substrate table WT relative to the mask table MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

c. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

The term "lens", where the context allows, may refer to any one or combination of various types of optical components, including refractive, reflective, magnetic, electromagnetic and electrostatic optical components.

The terms "radiation" and "beam" used herein encompass all types of electromagnetic radiation, including ultraviolet (UV) radiation (e.g. having a wavelength λ of 365, 248, 193, 157 or 126 nm) and extreme ultra-violet (EUV or soft X-ray) radiation (e.g. having a wavelength in the range of about 5-20 nm, e.g. about 13.5 nm), as well as particle beams, such as ion beams or electron beams. Generally, radiation having wavelengths between about 780-3000 nm (or larger) is considered IR radiation. UV refers to radiation with wavelengths of approximately 100-400 nm. Within lithography, it is usually also applied to the wavelengths which can be produced by a mercury discharge lamp: G-line 436 nm; H-line 405 nm; and/or I-line 365 nm. VUV is Vacuum UV (i.e. UV absorbed by air) and refers to wavelengths of approximately 100-200 nm. DUV is Deep UV, and is usually used in lithography for the wavelengths produced by excimer lasers like 126 nm-248 nm. The person skilled in the art understands that radiation having a wavelength in the range of, for example, about 5-20 nm relates to radiation with a certain wavelength band, of which at least part is in the range of about 5-20 nm.

Figure 2:
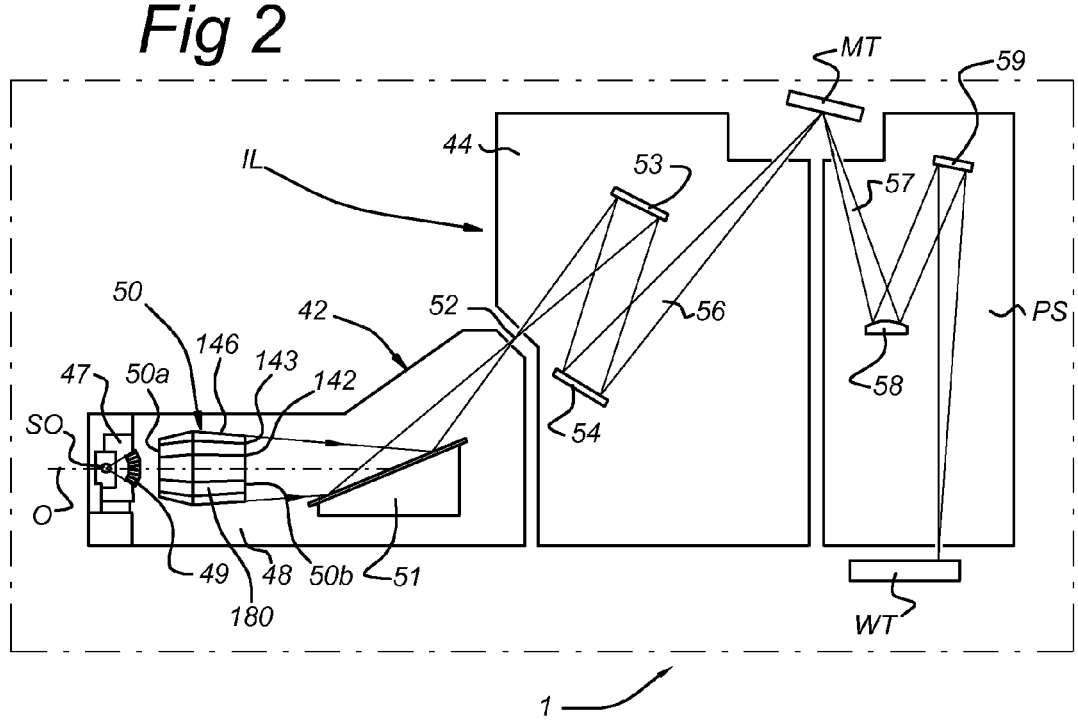
FIG. 2 schematically depicts a side view of an EUV illumination system and projection optics of a lithographic projection apparatus according to an embodiment of FIG. 1.

FIG. 2 shows the projection apparatus 1 in more detail, including a radiation system 42, an illumination optics unit 44, and the projection system PS. The radiation system 42 includes the radiation source SO which may be formed by a discharge plasma. EUV radiation may be produced by a gas or vapor, for example Xe gas, Li vapor or Sn vapor in which a very hot plasma is created to emit radiation in the EUV range of the electromagnetic spectrum. The very hot plasma is created by causing an at least partially ionized plasma by, for example, an electrical discharge. Partial pressures of, for example, about 10 Pa of Xe, Li, Sn vapor or any other suitable gas or vapor may be desired for efficient generation of the radiation. In an embodiment, a Sn source as EUV source is applied. The radiation emitted by radiation source SO is passed from a source chamber 47 into a collector chamber 48 via an optional gas barrier or contaminant trap 49 (also indicated as contaminant barrier or foil trap) which is positioned in or behind an opening in source chamber 47. The contaminant trap 49 may comprise a channel structure. Contamination trap 49 may also comprise a gas barrier or a combination of a gas barrier and a channel structure. The contaminant trap or contaminant barrier 49 further indicated herein at least comprises a channel structure, as known in the art.

The collector chamber 48 includes a radiation collector 50 (herein also indicated as collector mirror) which may be formed by a grazing incidence collector. Radiation collector 50 has an upstream radiation collector side 50a and a downstream radiation collector side 50b. Radiation passed by collector 50 can be reflected off a grating spectral filter 51 to be focused in a virtual source point 52 at an aperture in the collector chamber 48. From collector chamber 48, a beam of radiation 56 is reflected in illumination optics unit 44 via normal incidence reflectors 53, 54 onto a reticle or mask positioned on reticle or mask table MT. A patterned beam 57 is formed which is imaged in projection system PS via reflective elements 58, 59 onto wafer stage or substrate table WT. More elements than shown may generally be present in illumination optics unit 44 and projection system PS. Grating spectral filter 51 may optionally be present, depending upon the type of lithographic apparatus. Further, there may be more mirrors present than those shown in the Figures, for example there may be 1-4 more reflective elements present than 58, 59. Radiation collectors 50 are known from the prior art.

Instead of a grazing incidence mirror as collector mirror 50, also a normal incidence collector may be applied. Collector mirror 50, as described herein in an embodiment in more detail as nested collector with reflectors 142, 143, and 146, and as schematically depicted in amongst others FIG. 2 is herein further used as example of a collector (or collector mirror). Hence, where applicable, collector mirror 50 as grazing incidence collector may also be interpreted as collector in general and in a specific embodiment also as normal incidence collector. Hence, instead of or in addition to a (Ru coated) grazing incidence collector a multilayer normal incidence collector may be applied. Sn deposition on a multilayer collector may be more desired for reflection. Deposition of for instance only about 1 nm of Sn on such a mirror (either in the source or in the illuminator) might lead to a loss of reflection of at least about 10%. A multilayer mirror however reflects out of band radiation as good as or even better than EUV. This might lead to even higher out of band radiation content at the wafer as compared to that emitted by plasma. Further, also part of the laser radiation used for creating the plasma (for example $CO_2$ laser is emitting at 10.6 μm (also considered IR)) of the plasma source (as embodiment of source SO) might penetrate into the lithographic apparatus 1.

Further, instead of a grating 51, as schematically depicted in FIG. 2, also a transmissive optical filter may be applied, or in an embodiment, no filter 51 may be used at all. Optical filters transmissive for EUV and less transmissive for or even substantially absorbing UV radiation are known in the art. Hence, "grating spectral purity filter" is herein further indicated as "spectral purity filter" which includes gratings or transmissive filters. Not depicted in FIG. 2, but also included as optional optical element may be EUV transmissive optical filters, for instance arranged upstream of collector mirror 50, or optical EUV transmissive filters in illumination unit 44 and/or projection system PS.

In an embodiment (see also above), radiation collector 50 may be a grazing incidence collector. The collector 50 is aligned along an optical axis O. The source SO or an image thereof is located on optical axis O. The radiation collector 50 may include reflectors 142, 143, 146 (also known as a Wolter-type reflector comprising several Wolter-type reflectors). Sometimes they are also called shells. These reflectors (or shells) 142, 143, 146 may be nested and rotationally symmetric about optical axis O. In FIG. 2 (as well as in other Figures), an inner reflector is indicated by reference number 142, an intermediate reflector is indicated by reference number 143, and an outer reflector is indicated by reference number 146. The radiation collector 50 encloses a certain volume, i.e. the volume within the outer reflector(s) 146. Usually, this volume within outer reflector(s) 146 is circumferentially closed, although small openings may be present. All the reflectors 142, 143 and 146 include surfaces of which at least part includes a reflective layer or a number of reflective layers. Hence, reflectors 142, 143 and 146 (more reflectors may be present and embodiments of radiation collectors (also called collector mirrors) 50 having more than 3 reflectors or shells are comprised herein), are at least partly designed for reflecting and collecting EUV radiation from source SO, and at least part of the reflector may not be designed to reflect and collect EUV radiation. For example, at least part of the back side of the reflectors may not be designed to reflect and collect EUV radiation. The latter part may also be called back side. On the surface of these reflective layers, there may in addition be a cap layer for protection or as optical filter provided on at least part of the surface of the reflective layers.

The radiation collector 50 is usually placed in the vicinity of the source SO or an image of the source SO. Each reflector 142, 143, 146 may comprise at least two adjacent reflecting surfaces, the reflecting surfaces further from the source SO being placed at smaller angles to the optical axis O than the reflecting surface that is closer to the source SO. In this way, a grazing incidence collector 50 is configured to generate a beam of (E)UV radiation propagating along the optical axis O. At least two reflectors may be placed substantially coaxially and extend substantially rotationally symmetric about the optical axis O. It should be appreciated that radiation collector 50 may have further features on the external surface of outer reflector 146 or further features around outer reflector 146, for example a protective holder, a heater, etc. Reference number 180 indicates a space between two reflectors, e.g. between reflectors 142 and 143.

Referring to FIGS. 1 and 2, the optical element according to the invention may be arranged at different places within the lithographic apparatus 1, and may have (therefore) different function. The optical element for use in the lithographic apparatus 1 is now further described with specific reference to FIGS. 3a-3d, which schematically depict a number of embodiments of the optical element according to the invention. The optical element is indicated with reference 100.

Figure 3A:
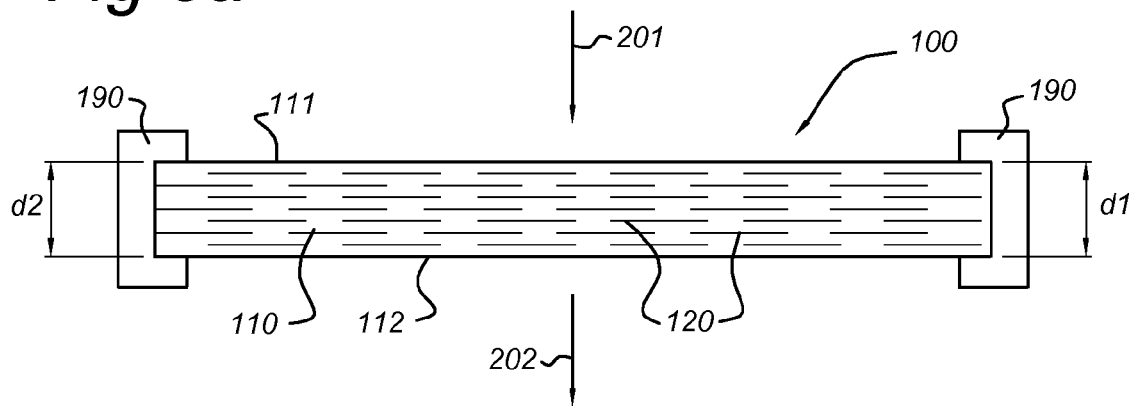
FIGS. 3a-3d schematically depict embodiments of an optical elements of the lithographic apparatus of FIG. 1, as well as a multi-layer mirror with a carbon nanotube sheet as a top layer.
Figure 3B:
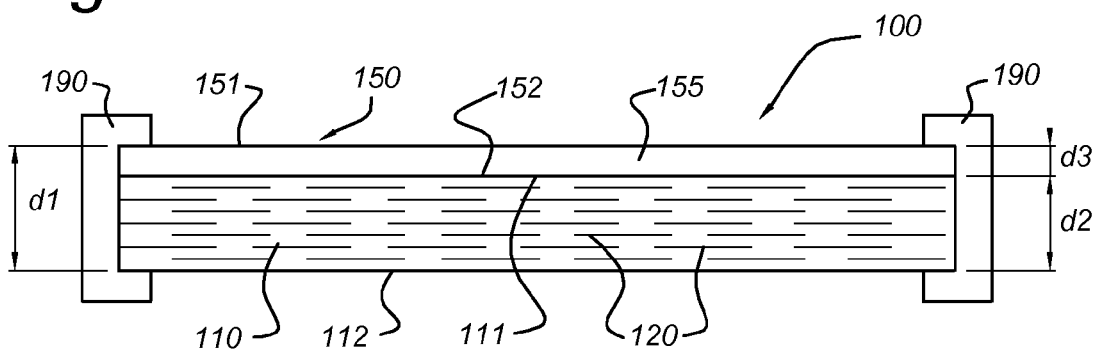
Figure 3C:
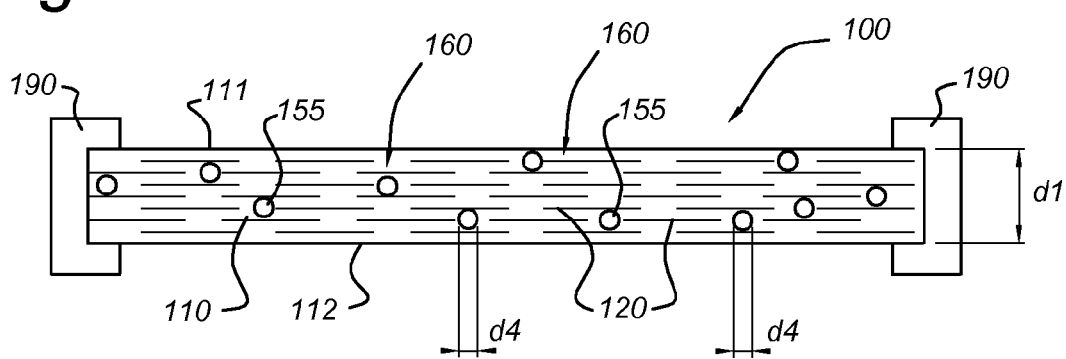

Referring to FIGS. 3a-3c, the optical element 100 comprises an oriented carbon nanotube sheet 110 (herein also indicated as "sheet" or "nanotube sheet"). The term "oriented" refers to the axis of the nanotubes. The nanotubes may be non-oriented or oriented. In the invention, the nanotubes are oriented, with the orientation preferably substantially parallel to the surface of the sheet, and thus preferably substantially perpendicular to the propagation of the beam of light or parallel to the optical axis.

In FIG. 3a, such oriented nano-tube sheet is depicted, with the sheet having reference 110, and the oriented nanotubes having reference 120. The sheet 110 has an upper and a lower face, indicated with references 111 and 112, respectively. To the person skilled in the art, it will be clear that the terms "upper" and "lower" are relative, and do not limit the application of the optical element 100 in horizontal configurations as schematically depicted in FIGS. 3a-3c.

By way of example, the nanotube sheet 110 is enclosed by a holder 190, but, such holder 190 is optional, and is not limiting in any way.

The optical element 100 has a element thickness d1 in the range of about 20-500 nm. The nanotube sheet 110 has a sheet thickness d2, which is in this schematically depicted embodiment equal to the element thickness of the optical element 100. In general, the sheet 110 will substantially be flat, with substantially parallel faces 111 and 112, respectively.

By way of example, a beam of radiation 201 impinging on the optical element 100 is drawn, and a transmitted beam of radiation 202, being transmitted by the optical element 100. The former beam is an upstream beam; the latter beam is a downstream beam. Relative to the upstream beam, the transmitted radiation is relatively richer in EUV radiation, or more precisely, the ratio of EUV radiation to undesired radiation, such as IR and/or DUV radiation, is increased. The optical element 100 has a transmission for EUV radiation having a wavelength in the range of about 1-20 nm of at least about 20% under perpendicular irradiation with the EUV radiation, more especially, the optical element 100 has a transmission for EUV radiation having a wavelength in the range of about 1-20 nm in the range of about 30-95% under perpendicular irradiation with the EUV radiation. The transmission especially depends upon the sheet thickness of the carbon-nanotube sheet 110, the layer thickness of the optional transmissve material layer (see below) and the density and particle size of the optional EUV transmissive particles (see below). The person skilled in the art may choose those parameters in such a way, that the desired transmission is obtained.

The oriented carbon nanotube sheet 110 may be used per se as optical element 100, for instance designed to reduce debris and/or improve the ratio of EUV/non-desired radiation.

Such a sheet 110, due to its strength, does not necessarily need a support. Hence, the optical element 100 of the invention may be unsupported. Therefore, in an embodiment, the optical element 100 is self-supporting. The absence of supports may allow better transmission and/or may allow a more homogeneous transmission than with supports, such as for instance described in U.S. Pat. No. 7,250,620. The tensile strength of the nanotube sheet 110 may for instance be in the range of about 100-1500 MPa, or even above, such as about 200-1000 MPa. Another advantage of the nanotube sheets 110 is the relative low density. The density may be in the range of about 100-1000 kg/m$^3$, such as about 500 kg/m$^3$.

In an embodiment, the optical element 100 may further comprise an EUV transparent material layer 150, see FIG. 3b. The EUV transparent material layer 150 and the nanotube sheet 110 form a laminate. In FIG. 3a, the top face 111 of the nanotube sheet 110 is in contact with a bottom face 152 of the EUV transparent material layer 150. The EUV transparent material layer 150, herein also indicated as "material layer" further has a top face 151. Such EUV transparent material layer 150 may be arranged to further increase the ratio of EUV/non-desired radiation and/or to reduce or even eliminate propagation of debris while allowing transmission of EUV radiation. For instance, the absorption of undesired radiation by the nanotube sheet 110 may not be sufficient in some parts of the spectral region; the material layer 150 may complement this, thereby providing an embodiment of the optical element 100 even better reducing undesired radiation relative to EUV radiation. For instance, carbon may relatively strongly absorb radiation between about 45 and 105 nm, whereas Zr may relatively strongly absorb radiation in the range between about 25 and 45 nm, and in the range of about 85-150 nm.

The EUV transparent material layer 150 of the optical element 100 may comprise one or more elements selected from the group consisting of Be, B, C, Si, P, S, K, Ca, Sc, Sr, Rb, Y, Zr, Nb, Mo, Ru, Rh, Ag, Ba, La, Ce, Pr, Ir, Au, Pa and U, even more especially B, C, Si, Sr, Sc, Ru, Mo, Y and Zr, and yet even more especially Zr. The transparent material layer 150 may be a metallic layer (for those elements that may be metallic at room temperature). For instance, the transparent material layer 150 may comprise a metallic silicon layer or a metallic zirconium layer. Zr may especially be used, since it diminishes unwanted radiation and is relatively stable as metal. Also alloys of two or more of those elements may be applied. In this way, the transmission of desired and undesired radiation may be tuned.

Compounds comprising one or more of these elements may be applied as transparent material layer 150. In a specific embodiment, the EUV transparent material layer 150 of the optical element 100 comprises one or more materials selected from the group consisting of oxides, borides, and nitrides, which are solid at room temperature, of the one or more elements selected from the group consisting of Be, B, C, Si, P, S, K, Ca, Sc, Sr, Rb, Y, Zr, Nb, Mo, Ru, Rh, Ag, Ba, La, Ce, Pr, Ir, Au, Pa and U. Examples of such systems are for instance silicon oxide, zirconia, etc. Hence, oxides and/or borides and/or nitrides may be applied. Especially, those oxides, borides, and nitrides are applied that are solid at temperatures above about 200° C., especially above about 400° C., such as in the range of about 400-800° C. A further potential advantage of using the material layer 150 in combination with the carbon nanotube sheet 110, especially metallic material layers 150, such as those of Si, Zr, Ru, Th, Mo, etc., is that the heat generated in the material layer 150 may relatively easily dissipated by the nanosheet 110, because of the relative high thermal emissivity of the carbon nanotube sheet 110, such as preferably a thermal emissivity σ>about 0.9, such as in the range of about 0.9-1.

The material layer 150 may be a single layer or may comprise a plurality of layers. In the schematically depicted embodiment of FIG. 3a, a single layer is depicted. However, such a layer may consist of a plurality of layers (of which two or more may consist of different material when compared to each other).

Also combinations of such elements may be applied, either as separate layers (i.e. "laminate" or "laminate stack"), or as compounds or alloys. Hence, in an embodiment, the EUV transparent material layer 150 of the optical element 100 comprises one or more materials selected from the group consisting of SiC, B$_4$C and Si$_3$N$_4$. In another embodiment, the EUV transparent material layer 150 comprises a Si layer and a Zr layer, or more precisely, the optical element 100 comprises a laminate of the afore mentioned oriented carbon nanotube sheet 110 and a Si and Zr layer, of which one layer is attached to the nanotube sheet and the other is attached to the former layer. In another embodiment, the transparent material layer 150 comprises a Si or Zr metal layer, attached to the nanotube sheet 110, and another transparent material layer 150, comprising Si$_3$N$_4$ (for instance also for protection) on top of this Si or Zr layer, thereby forming a laminate of the nanotube sheet 110, the Si or Zr metal layer and the Si$_3$N$_4$ layer. The material of the transparent material layer, be it a metal, an alloy, an oxide, a carbide, etc, is indicated with reference 155.

The EUV transparent material layer 150 of the optical element 100 may especially have a layer thickness d3 in the range of about 5-200 nm. The oriented carbon nanotube sheet 110 of the optical element 100 may especially have a sheet thickness d2 in the range of about 10-500 nm. In total, the element thickness d1 of the optical element 100 is especially in the range of about 20-500 nm. Here, the element thickness d1 only relates to that part that is used as optical element 100, i.e. is especially used for transmission of EUV light. Optional holders or optional support structures are not included.

In an embodiment, schematically depicted in FIG. 3c, the optical element 100 further comprises EUV transparent material particles 160, wherein the EUV transparent material particles 160 are dispersed within the nanotube sheet 110. This embodiment may be combined with the embodiments described above, i.e. the optical element 100 comprises a transparent material layer 150 and transparent material particles 160 dispersed within the nanotube sheet. Such an embodiment is not schematically depicted, but can be seen as a combination of the embodiments schematically depicted in FIGS. 3b and 3c.

The EUV transparent material particles 160 of the optical element 100 may comprise one or more elements selected from the group consisting of Be, B, C, Si, P, S, K, Ca, Sc, Sr, Rb, Y, Zr, Nb, Mo, Ru, Rh, Ag, Ba, La, Ce, Pr, Ir, Au, Pa and U, especially B, C, Si, Sr, Sc, Ru, Mo, Y and Zr, even more especially Zr. The transparent material particles 160 may be metallic particles 160 (for those elements that may be metallic at room temperature). For instance, the transparent material particles 160 may comprise metallic silicon layer particles 160 or metallic zirconium particles 160.

Compounds comprising one or more of these elements may be applied as transparent material layer 150. In an embodiment, the EUV transparent material particles 160 of the optical element 100 may comprise one or more materials selected from the group consisting of oxides, borides, and nitrides, which are solid at room temperature, of the one or more elements selected from the group consisting of Be, B, C, Si, P, S, K, Ca, Sc, Sr, Rb, Y, Zr, Nb, Mo, Ru, Rh, Ag, Ba, La, Ce, Pr, Ir, Au, Pa and U. Examples of such systems are for instance silicon oxide, zirconia, etc. Hence, also here oxides and/or borides and/or nitrides may be applied. Especially, those oxides, borides, and nitrides are applied that are solid at temperatures above about 200° C., especially above about 400° C., such as in the range of about 400-800° C.

A potential advantage of using the material layer 150 in combination with the carbon nanotube sheet 110, especially metallic material particles 160, such as those of Si, Zr, Ru, Th, Mo, etc., is that the heat generated in the material particles 160 may relatively easily dissipated by the nanosheet 110, because of the relative high thermal emissivity of the carbon nanotube sheet 110.

Combinations of such elements may be applied, either as different type of particles 160, or as particles 160 comprising compounds or alloys. Hence, in an embodiment, the EUV transparent material particles 160 of the optical element 100 may comprise one or more materials 155 selected from the group consisting of SiC, $B_4C$ and $Si_3N_4$, especially $B_4C$. In another embodiment, the EUV transparent material particles 160 may comprise Si particles 160 and Zr particles 160. In an embodiment, the EUV transparent material particles 160 may comprise $B_4C$ particles 160.

The EUV transparent material particles 160 of the optical element 100 may especially have a mean particle size in the range of up to about 50 nm. The particle size (range) can be determined by for instance SEM. The mean particle size especially refers to the number averaged particle size.

In an embodiment, the oriented carbon nanotube sheet 110 of the optical element 100 comprises an oriented single-wall carbon nano-tube sheet. However, in another embodiment, the oriented carbon nanotube sheet 110 of the optical element 100 comprises an oriented multi-wall carbon nanotube sheet.

Figure 3D:
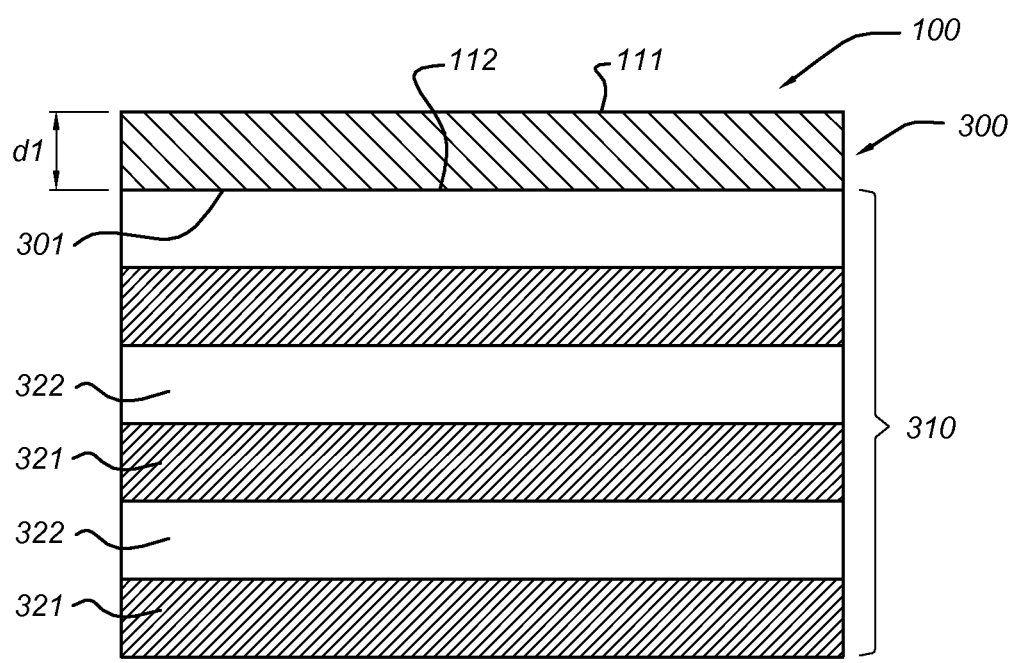

An embodiment of the invention is directed to a multi-layer mirror 300 comprising an oriented carbon nanotube sheet 110 having a sheet thickness d2 in the range of about 10-500 nm as top layer on such multi-layer mirror 300. Such an embodiment is schematically depicted in FIG. 3d. Multi-layer mirrors are known in the art, for instance from United States Pat. No. 6,449,086. Such a multi-layer mirrors may comprise alternating layers selected from the group consisting of Mo, Si, SiC, C, B, $B_4C$, and $Si_3N_4$, such as for instance the well-known Si—Mo multi-layer mirrors. FIG. 3d schematically depicts a multi-layer mirror stack 310 of alternating layers 321/322, for instance Si/Mo, with a multi-layer mirror stack top face 301, on top of which the optical element 100 is arranged. Here, the optical element 100 desirably only comprises the carbon nanotube sheet 110. Hence, on top (i.e. face 301) of such multi-layer mirror stack 310, the nano-tube sheet 110 may be applied, which allows further reduction of undesired radiation, and/or protection of the multi-layer mirror 300.

Figure 4A:
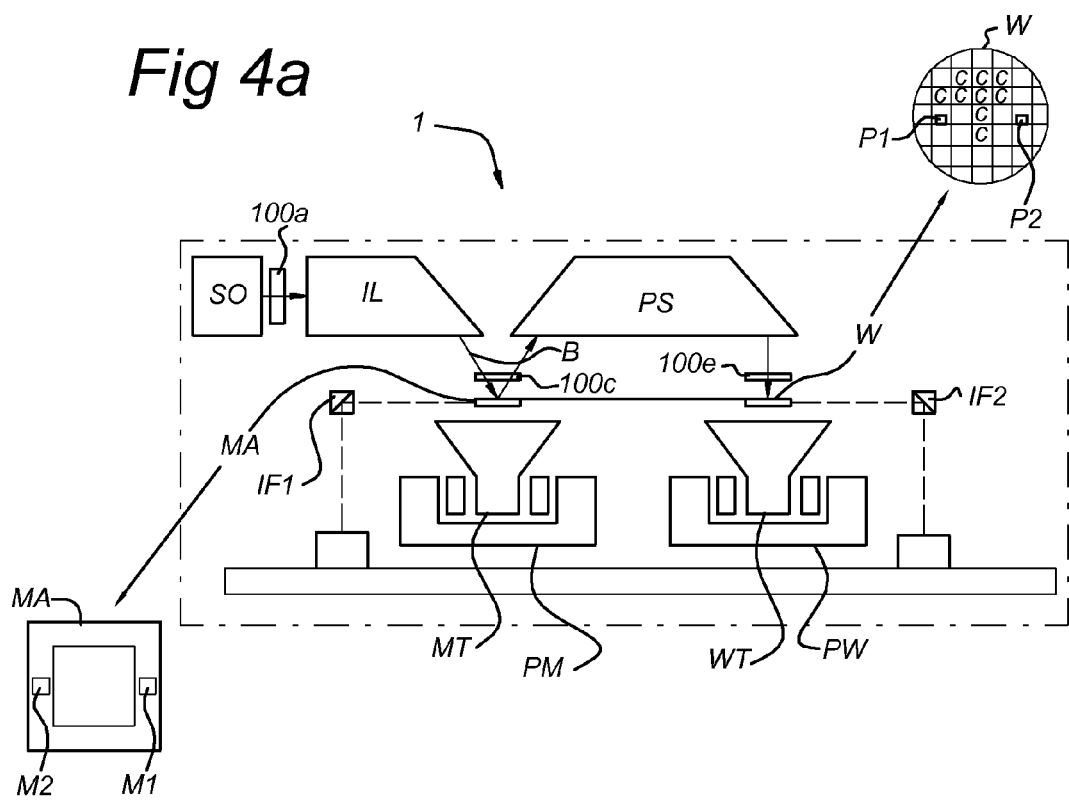
FIGS. 4a and 4b schematically depict a different arrangements of the optical element of FIG. 3a-3d within the lithographic apparatus.
Figure 4B:
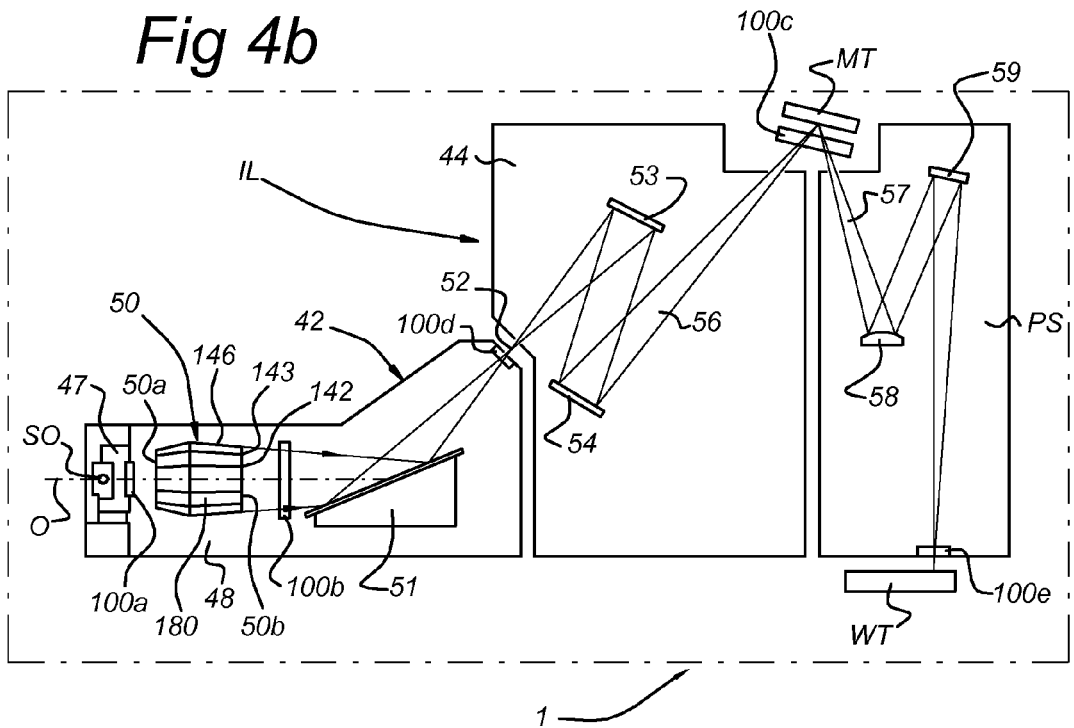

An embodiment of the invention is directed to the lithographic apparatus 1 comprising the optical element 100 as well as to the optical element 100 per se. Embodiments of the lithographic apparatus 1 in general are depicted in FIGS. 1 and 2; non-limiting embodiments of the lithographic apparatus 1 with the optical element 100 are schematically depicted in FIGS. 4a and 4b.

The lithographic apparatus 1 according to the invention has a source SO of EUV radiation and further optical elements like mirrors 51, 53, 54, 58, 59, etc. The optical element 100 may be arranged as a debris trapping system 100a arranged downstream of the source of EUV radiation and upstream of the further optical elements. A known debris trapping system described above as "contamination trap" (also known as "foil trap"), indicated with reference 49. Such contamination traps (like stationary and/or rotation foils) are known in the art, such as for instance described by Shmaenok et al. in Proceedings of the SPIE—The International Society for Optical Engineering Volume: 3331 Pages: 90-4, 1998, Conference Information: Emerging Lithographic Technologies II, Santa Clara, Calif., USA, 23-25 Feb. 1998. The debris trapping system 100a according to an embodiment of the invention may substitute such contamination trap 49 or may be applied in addition of such contamination traps 49, either upstream or downstream of such contamination traps 49. In FIGS. 4a and 4b, the debris trapping system 100a is arranged downstream of the source SO of EUV radiation and upstream of the further optical elements of lithographic apparatus 1. In FIGS. 4a and 4b, no known contamination trap 49 is depicted, although such contamination trap 49 may nevertheless be present in an embodiment.

Within the lithographic apparatus 1, the optical element 100 may in an embodiment be arranged as a transmissive spectral purity filter 100b.

Further, the optical element 100 may be arranged as a mask pellicle 100c within the lithographic apparatus 1, i.e. between a last optical element 100 before the mask MA and the mask MA itself (thus downstream of a last optical element 100 before the mask MA and upstream of the mask MA itself). Such mask pellicle 100c may further reduce debris from reaching the target (wafer), and/or reduce undesired radiation such as IR and/or DUV radiation and/or may reduce influx of undesired components into the mask upstream parts of the lithographic apparatus 1. For instance, compounds from the resists or compounds generated during lithographic processing may be prevented from entering the mask upstream parts of the lithographic apparatus 1 by such pellicle 100c. Pellicles are known in the art, for instance from U.S. Pat. No. 7,379,154.

In an embodiment, the optical element 100 may be arranged as a gas-lock 100d. Gas-locks may be used as intermediate devices between two compartments with (temporarily) different pressures. Gas-locks are known in the art, and are for instance described in Shmaenok et al (see also above). Usually, a gas lock is a narrow opening through which a gas is pumped so fast that the molecular diffusion against the flow is suppressed. The gas-lock 100d according to an embodiment of the invention may especially have an element thickness d1 (i.e. the thickness d1 of the optical element 100) above 50 nm, especially in the range of 300-500 nm. Such a gas-lock 100d may withstand considerable pressure differences. The gas-lock 100d of the invention may thus be closed for gas, but transmit EUV radiation.

In an embodiment, the optical element 100 may be arranged as a window 100e within the lithographic apparatus 1. For instance, such window 100e may be a gas-lock 100d, but may also be a window 100e between compartments having substantially the same pressure. Hence, an embodiment of the invention is also directed to a window 100e comprising the optical element 100 according to embodiments of the invention.

As will be clear to the person skilled in the art, the lithographic apparatus 1 according to the invention may comprise one or more devices selected from the group consisting of a transmissive spectral purity filter 100b, a gas-lock 100d, a window 100e, a debris trapping system 100a, a mask pellicle 100c.

As mentioned above, the production of nano-tube sheets per se is known in the art (see above). The production of the specific embodiments of the optical element 100 comprising the transparent material layer 150, or the transparent material particles 160 (or both) is also part of the invention.

In an embodiment, the invention provides a method for the production of an optical element 100 comprising an oriented multi-wall carbon nanotube sheet 110 and an EUV transparent material, the method comprising providing an oriented carbon nanotube sheet 110, and sputtering the EUV transparent material, or a precursor thereof, to the oriented multi-wall carbon nanotube sheet 110. Especially, sputtering comprises magnetron sputtering, but also other techniques may be used. Suitable techniques may comprise magnetron sputtering, e-beam sputtering, laser sputtering, plasma assisted film growth, CVD (chemical vapor deposition) or a combination of two or more of such techniques (such as for instance laser sputtering in combination with a plasma). During sputtering, the nanotube sheet may be heated at a temperature in the range of about 100-500° C., for example, to further improve layer formation and/or particles 160 dispersion. After sputtering, the product obtained, i.e. the optical element 100 with the nanoparticles 160 (which may include atoms) or the optical element 100 comprising the transparent material layer 150, may be annealed, for instance further improving layer formation and/or particles 160 dispersion.

Optionally, subsequent to sputtering, the sputtered EUV transparent material may be reacted with a fluid comprising one or more elements selected from the group consisting of B, C, N and O, especially selected from the group consisting of nitrogen and oxygen (such as $N_2$, $O_2$, NO, $NO_2$, etc.). For instance, one may sputter with metal, such as Zr or Si, and than anneal the optical element 100 with sputtered metal in an atmosphere comprising nitrogen or oxygen, such as $N_2$ or $O_2$, whereby formation zirconium nitride or silicon nitride and zirconia and silica, respectively, may occur.

The term "substantially" herein refers in an embodiment to "completely". In another embodiment, especially when relating to values, it may for instance refer to about 95-100%. The person skilled in the art understands the term "substantially". Likewise, the term "at least partially" herein refers in an embodiment to "completely". In another embodiment, it may for instance refer to about 95-100%. The term "comprise" includes also embodiments wherein the term "comprises" means "consists of".

Although specific reference may be made in this text to the use of lithographic apparatus 1 in the manufacture of ICs, it should be appreciated that the lithographic apparatus 1 described herein may have other applications, such as the manufacture of integrated optical systems, guidance and detection patterns for magnetic domain memories, flat-panel displays, flat panel displays including liquid-crystal displays (LCDs), thin-film magnetic heads, etc. It should be appreciated that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

While specific embodiments of the present invention have been described above, it should be appreciated that the present invention may be practiced otherwise than as described. For example, the present invention may take the form of a computer program containing one or more sequences of machine-readable instructions describing a method as disclosed above, or a data storage medium (e.g. semiconductor memory, magnetic or optical disk) having such a computer program stored therein. This computer program may be used to control the removal of the deposition, control the pressures, etc.

The descriptions above are intended to be illustrative, not limiting. Thus, it will be apparent to one skilled in the art that modifications may be made to the present invention as described without departing from the scope of the claims set out below. Use of the verb "to comprise" and its conjugations does not exclude the presence of elements or steps other than those stated in a claim. The article "a" or "an" preceding an element does not exclude the presence of a plurality of such elements.

The present invention is not limited to application of the lithographic apparatus 1 or use in the lithographic apparatus 1 as described in the embodiments. Further, the drawings usually only include the elements and features that are needed to understand the present invention. Beyond that, the drawings of the lithographic apparatus 1 are schematic and not on scale. The present invention is not limited to those elements, shown in the schematic drawings. Further, the present invention is not confined to the lithographic apparatus 1 described in relation to FIG. 1 or 2. It should be appreciated that embodiments described above may be combined.

What is claimed is:

1. A lithographic apparatus comprising an optical element, the optical element comprising an oriented carbon nanotube sheet comprising:
    oriented nanotubes and EUV transparent material particles, the particles having a mean particle size up to 50 nm and being separate and distinct from the oriented nanotubes dispersed within the nanotube sheet, the optical element having an element thickness in the range of about 20-500 nm and having a transmission for EUV radiation having a wavelength in the range of 1-20 nm of at least 20% under perpendicular irradiation with the EUV radiation, the optical element being adapted to be self-supporting.

2. The lithographic apparatus according to claim 1, wherein the optical element further comprises an EUV transparent material layer, wherein the EUV transparent material layer and the nanotube sheet form a laminate.

3. The lithographic apparatus according to claim 2, wherein the EUV transparent material layer of the optical element comprises one or more elements selected from the group consisting of Be, B, C, Si, P, S, K, Ca, Sc, Sr, Rb, Y, Zr, Nb, Mo, Ru, Rh, Ag, Ba, La, Ce, Pr, Ir, Au, Pa and U.

4. The lithographic apparatus according to claim 2, wherein the EUV transparent material layer of the optical element comprises one or more materials selected from the group consisting of oxides, borides, and nitrides, which are solid at room temperature, of the one or more elements selected from the group consisting of Be, B, C, Si, P, S, K, Ca, Sc, Sr, Rb, Y, Zr, Nb, Mo, Ru, Rh, Ag, Ba, La, Ce, Pr, Ir, Au, Pa and U.

5. The lithographic apparatus according to claim 2, wherein the EUV transparent material layer of the optical element comprises one or more materials selected from the group consisting of SiC, $B_4C$ and $Si_3N_4$.

6. The lithographic apparatus according to claim 1, wherein the EUV transparent material particles of the optical element comprise one or more elements selected from the group consisting of Be, B, C, Si, P, S, K, Ca, Sc, Sr, Rb, Y, Zr, Nb, Mo, Ru, Rh, Ag, Ba, La, Ce, Pr, Ir, Au, Pa and U.

7. The lithographic apparatus according to claim 1, wherein the EUV transparent material particles of the optical element comprises one or more materials selected from the group consisting of oxides, borides, and nitrides, which are solid at room temperature, of the one or more elements selected from the group consisting of Be, B, C, Si, P, S, K, Ca, Sc, Sr, Rb, Y, Zr, Nb, Mo, Ru, Rh, Ag, Ba, La, Ce, Pr, Ir, Au, Pa and U.

8. The lithographic apparatus according to claim 1, wherein the EUV transparent material particles of the optical element comprise one or more materials selected from the group consisting of SiC, $B_4C$ and $Si_3N_{44}$.

9. The lithographic apparatus according to claim 8, wherein the EUV transparent material particles of the optical element comprise $B_4C$.

10. The lithographic apparatus according to claim 1, wherein the oriented carbon nanotube sheet has a tensile strength between 100-1500 MPa.

11. The lithographic apparatus according to claim 10, wherein the oriented carbon nanotube sheet has a tensile strength between 200-1000 MPa.

12. The lithographic apparatus according to claim 1, wherein the optical element comprises one or more devices selected from the group consisting of: a transmissive spectral purity filter, a gas-lock, a window, a debris trapping system, and a mask pellicle.

13. The lithographic apparatus according to claim 1, wherein the oriented carbon nanotube sheet is adapted to be self-supporting.

14. An optical element comprising an oriented carbon nanotube sheet comprising:
    oriented nanotubes and EUV transparent material particles, the particles having a mean particle size up to 50 nm and being separate and distinct from the oriented nanotubes, dispersed within the nanotube sheet, the optical element having an element thickness in the range of about 20-500 nm and having a transmission for EUV radiation having a wavelength in the range of about 1-20 nm of at least about 20% under perpendicular irradiation with the EUV radiation, the optical element being adapted to be self-supporting.

15. The optical element according to claim 14, wherein the oriented carbon nanotube sheet has a tensile strength between 100-1500 MPa.

16. The optical element according to claim 15, wherein the oriented carbon nanotube sheet has a tensile strength between 200-1000 MPa.

17. The optical element according to claim 14, comprising one or more devices selected from the group consisting of: a transmissive spectral purity filter, a gas-lock, a window, a debris trapping system, and a mask pellicle.

18. The optical element according to claim 14, wherein the oriented carbon nanotube sheet is adapted to be self-supporting.

* * * * *